(12) United States Patent
Jiang et al.

(10) Patent No.: US 8,773,198 B2
(45) Date of Patent: Jul. 8, 2014

(54) AUTO-ZERO AMPLIFIER AND SENSOR MODULE USING SAME

(75) Inventors: Shiueshr Jiang, Yuanlin Township, Changhua County (TW); An-Tung Chen, Pingzhen (TW); Jo-Yu Wang, New Taipei (TW); Jen-Hung Chi, Taichung (TW)

(73) Assignee: Richtek Technology Corporation, Zhubei, Hsinchu County (TW)

( * ) Notice: Subject to any disclaimer, the term of this patent is extended or adjusted under 35 U.S.C. 154(b) by 2 days.

(21) Appl. No.: 13/571,903

(22) Filed: Aug. 10, 2012

(65) Prior Publication Data
US 2013/0038388 A1 Feb. 14, 2013

(30) Foreign Application Priority Data
Aug. 12, 2011 (TW) .............................. 100128817 A

(51) Int. Cl.
*H03F 3/45* (2006.01)
(52) U.S. Cl.
USPC ................................................ 330/69; 330/9
(58) Field of Classification Search
USPC ................... 330/9, 69; 327/124, 307
See application file for complete search history.

(56) References Cited

U.S. PATENT DOCUMENTS

| | | | | |
|---|---|---|---|---|
| 4,691,125 A | * | 9/1987 | Rybicki | 327/96 |
| 5,621,319 A | | 4/1997 | Bilotti et al. | |
| 7,148,727 B2 | * | 12/2006 | Van Bogget | 327/77 |
| 7,622,988 B2 | * | 11/2009 | Denison et al. | 330/9 |
| 7,701,208 B2 | | 4/2010 | Nishikawa | |
| 2010/0117640 A1 | | 5/2010 | Sugiura | |

OTHER PUBLICATIONS

Bilotti et al., "Monolithic Magnetic Hall Sensor Using Dynamic Quadrature Offset Cancellation", IEEE Journal of Solid-State Circuits, vol. 32, No. 6 Jun. 1997 pp. 829-836.

* cited by examiner

*Primary Examiner* — Khanh V Nguyen
(74) *Attorney, Agent, or Firm* — Birch, Stewart, Kolasch & Birch, LLP

(57) ABSTRACT

An auto-zero amplifier is disclosed, having an amplifying circuit, a switch, and a difference signal generating circuit. The amplifying circuit receives a first input signal for generating a first output signal, and receives a second input signal for generating a second output signal. The switch is coupled between the amplifying circuit and a capacitor. The switch is conducted for charging or discharging the capacitor to a voltage with the first output signal, and the switch is not conducted for keeping the capacitor at the voltage. The difference signal generating circuit is coupled with the amplifying circuit and the capacitor for generating a difference signal of the first output signal and the second output signal, a multiple of the difference signal, a part of the difference signal, and/or a digital output value for the difference signal.

20 Claims, 2 Drawing Sheets

AUTO-ZERO AMPLIFIER AND SENSOR MODULE USING SAME

CROSS-REFERENCE TO RELATED APPLICATIONS

This application claims the benefit of priority to Taiwanese Patent Application No. 100128817, filed on Aug. 12, 2011, the entirety of which is incorporated herein by reference for all purposes.

BACKGROUND

The present disclosure generally relates to an amplifier and, more particularly, to the auto-zero amplifier and relevant circuits.

Sensors are widely adopted in many applications for detecting small signals. The detected signals are amplified for further signal processing. For example, the Hall effect sensor is often used for detecting the magnetic field. The Hall effect sensor may, however, only generate a few microvolts of detected signal when the detected magnetic field is one Gauss. When the detected signals are amplified by the amplifiers, the offset voltage of the sensor (e.g., the Hall Plate), the offset voltage of the amplifier, and the noise in the circuits are often much greater than the detected signals. Therefore, the amplified detected signals are no longer accurate.

The auto-zero amplifier is one of the amplifier architectures specific to processing small signals. In the auto-zero amplifier, the amplified signals and other offset voltages are stored in a plurality of capacitors (e.g., two or four capacitors). The signals stored in the capacitors are summed or subtracted to cancel out the offset voltages, and the amplified signals generated by the auto-zero amplifier may be more accurate.

Nevertheless, it takes time for charging the capacitors in the auto-zero amplifier. If there are many capacitors or the capacitances of the capacitors are large, the charging time will be even elongated accordingly. Thus, the auto-zero amplifier may not function normally when input signals vary too fast. The response time, the bandwidth, and the operation frequency of the auto-zero amplifier is therefore limited.

SUMMARY

An exemplary embodiment of an example auto-zero amplifier is disclosed comprising: an amplifying circuit, comprising a first input end and a second input end, for receiving a first input signal in a first period and receiving a second input signal in a second period, respectively; and comprising a first output end, for generating a first output signal according to the first input signal in the first period and for generating a second output signal according to the second input signal in the second period; a first switch, coupled between the first output end and a capacitor, for charging or discharging the capacitor to a voltage with the first output signal when the first switch is conducted, and for keeping the capacitor at the voltage when the first switch is not conducted; and a difference signal generating circuit, comprising a third input end coupled with the first output end of the amplifying circuit and a fourth input end coupled with the capacitor, for generating a first difference signal of the first output signal and the second output signal, a multiple of the first difference signal, a part of the first difference signal, and/or a digital value of the first difference signal at a second output end according to the second output signal and the voltage of the capacitor in the second period.

Another exemplary embodiment of an example sensor module is disclosed comprising: a Hall effect sensor, comprising a first end, a second end, a third end, and a fourth end, for providing a first detected signal at the first end and the second end in a first period and providing a second detected signal at the third end and the fourth end in a second period; an amplifying circuit, coupled with the Hall effect sensor, comprising a first input end and a second input end, for receiving the first detected signal in the first period and receiving the second detected signal in the second period, respectively; and comprising a first output end, for providing a first output signal according to the first detected signal in the first period and providing a second output signal according to the second detected signal in the second period; a switch, coupled between the first output end and a capacitor, for charging or discharging the capacitor to a voltage with the first output signal when the switch is conducted, and for keeping the capacitor at the voltage when the switch is not conducted; and a difference signal generating circuit, comprising a third input end coupled with the first output end of the amplifying circuit and a fourth input end coupled with the capacitor, for generating a first difference signal between the first output signal and the second output signal, a multiple of the first difference signal, a part of the first difference signal, and/or a digital value of the first difference signal at a second output end according to the second output signal and the voltage of the capacitor in the second period.

Another exemplary embodiment of an example auto-zero amplifier . . . is disclosed comprising: an amplifying circuit, for generating a first output signal according to a first input signal, and generating a second output signal according to a second input signal; a switch, coupled between the amplifying circuit and a capacitor, for charging or discharging the capacitor to a voltage with the first output signal when the switch is conducted, and for keeping the capacitor keeping the voltage when the switch is not conducted; and a difference signal generating circuit, coupled with the amplifying circuit and the capacitor, for generating a first difference signal of the first output signal and the second output signal, a multiple of the first difference signal, a part of the first difference signal, and/or a digital output value for the first difference signal according to the second output signal and the voltage of the capacitor.

DETAILED DESCRIPTION

Reference will now be made in detail to embodiments of the invention, which are illustrated in the accompanying drawings. The same reference numbers may be used throughout the drawings to refer to the same or like parts or components/operations.

Figure 1:
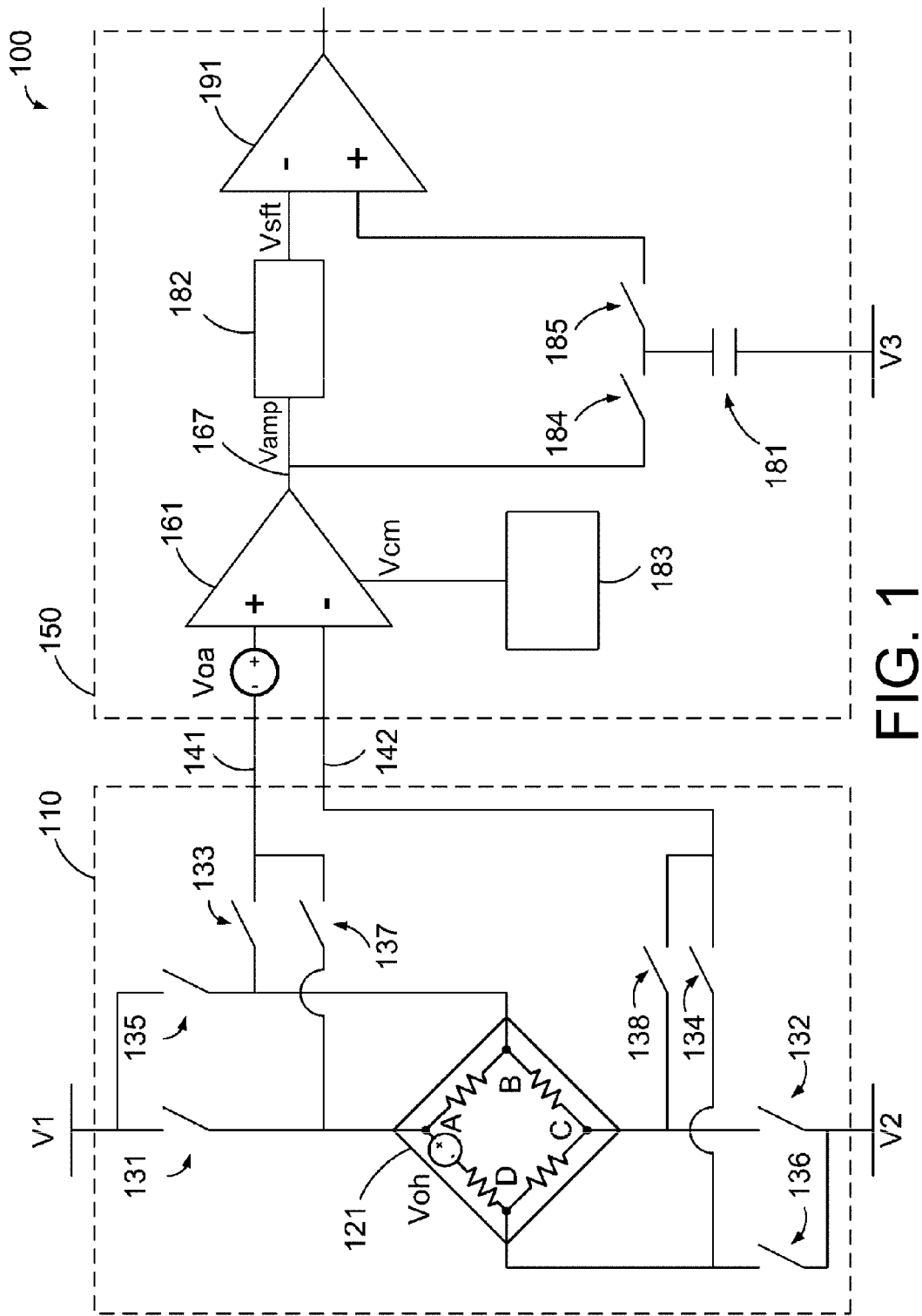
FIG. 1 shows a simplified functional block diagram of an example sensor module.
Figure 2:
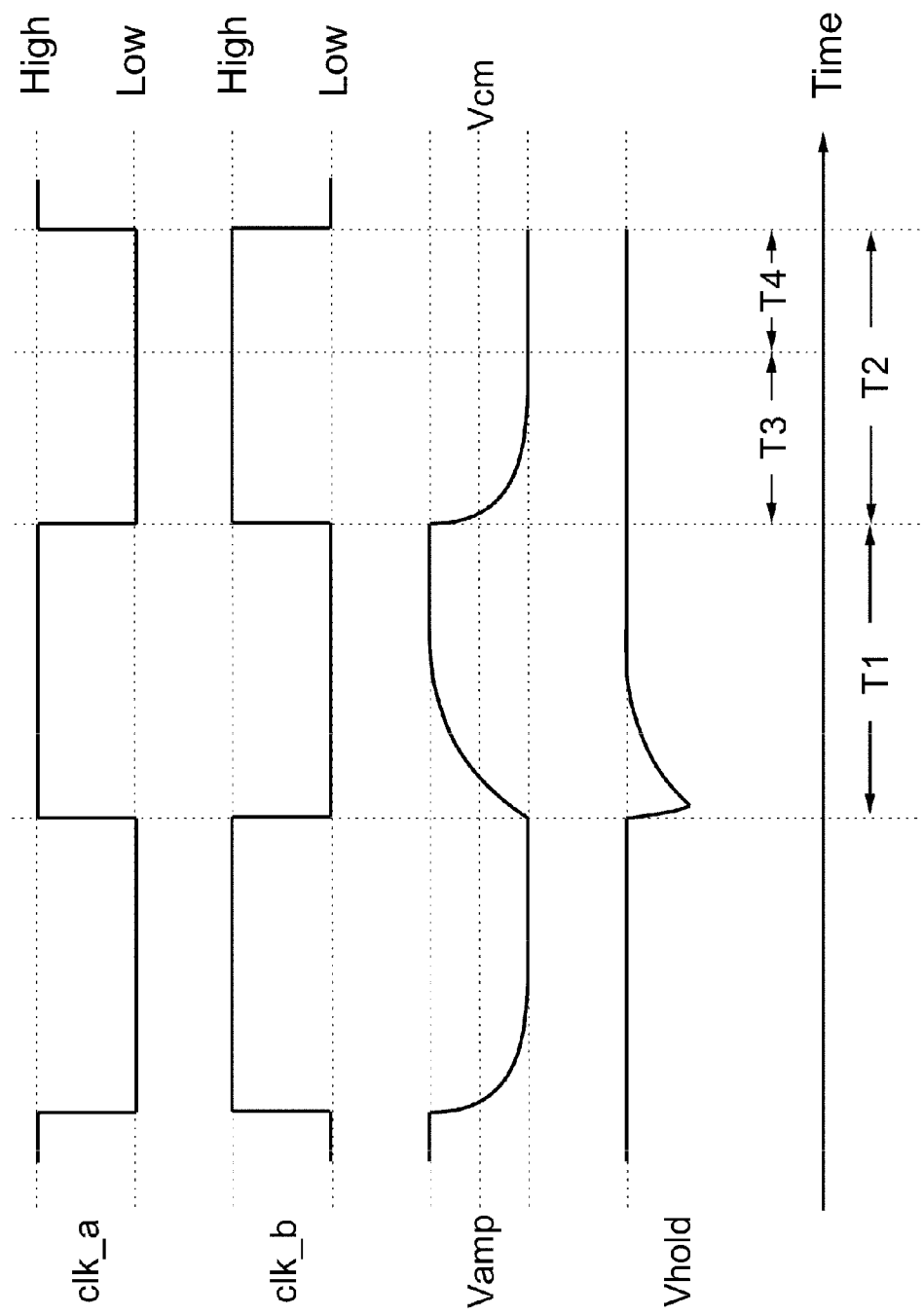
FIG. 2 shows a simplified timing diagram of the signals in the sensor module in FIG. 1, all arranged in accordance with at least some embodiments of the disclosure described herein.

FIG. 1 shows a simplified functional block diagram of an example sensor module 100, in accordance with at least some embodiments of the disclosure. The sensor module 100 comprises a Hall effect sensor 110 and an auto-zero amplifier 150. FIG. 2 shows a simplified timing diagram of the signals in the sensor module 100 in FIG. 1, in accordance with at least some embodiments of the disclosure. The operation of the sensor module 100 is further explained below with FIGS. 1 and 2.

The Hall effect sensor 110 comprises a Hall plate 121, switches 131~138, and output ends 141 and 142. The Hall plate 121 comprises four ends, A, B, C, and D. In FIG. 1, the equivalent offset voltage of the Hall plate 121 is expressed as a voltage Voh coupled between the ends A and D of the Hall plate 121 for the purpose of easier explanation.

When the control signal clk_a is active (e.g., in the high voltage level), the switches 131~134 are conducted. When the control signal clk_a is inactive (e.g., in the low voltage level), the switches 131~134 are not conducted. When the control signal clk_b is active (e.g., in the high voltage level), the switches 135~138 are conducted. When the control signal clk_b is inactive (e.g., in the low voltage level), the switches 135~138 are not conducted.

By suitably conducting or not conducting the switches 131~138, the four ends A-D of the Hall plate 121 are respectively coupled with a voltage level V1, a voltage level V2, the output end 141, and the output end 142 for providing detected signals at the output ends 141 and 142. The voltage levels V1 and V2 may be respectively coupled with suitable voltage sources or current sources to provide currents to the Hall plate 121 for detecting the magnetic field. In this embodiment, V1 is configured to be a positive voltage Vdd and V2 is configured to be the voltage level of the ground.

In this embodiment, the control signals clk_a and clk_b may not be active at the same time but may be configured to be inactive at the same time. Therefore, when the control signal clk_a is active and the control signal clk_b is inactive, the output voltage between the output ends 141 and 142 of the Hall effect sensor 110 is Vh+Voh, wherein Vh is the detected voltage signal generated by the Hall plate 121 in correspondence to the detected magnetic field. The detected voltage Vh may be a positive voltage or a negative voltage according to the direction of the magnetic field. When the control signal clk_b is active and the control signal clk_a is inactive, the output voltage between the output ends 141 and 142 of the Hall effect sensor 110 is −Vh+Voh. In this embodiment, the four-end Hall plate 121 is operated with the quadrature biasing method for generating the detected signals so that the offset voltage Voh of the Hall plate 121 may be eliminated or reduced by the auto-zero amplifier 150.

The auto-zero amplifier 150 comprises an amplifying circuit 161, a capacitor 181, a level-shift circuit 182, a reference signal generating circuit 183, switches 184 and 185, and a difference signal generating circuit 191. The amplifying circuit 161 may be realized with any suitable amplifier architecture, e.g., one or more instrumentation amplifiers or fully differential amplifiers with suitable gains. Moreover, the equivalent offset voltage of the amplifying circuit 161 is expressed as a voltage Voa in FIG. 1 for the purpose of easier explanation.

After the voltage Vi between the output ends 141 and 142 of the Hall effect sensor 110 are transmitted to the amplifying circuit 161, an output signal Vamp=Vcm+G×(Vi+Voa) is generated at the output end 167 of the amplifying circuit 161 according to the gain G of the amplifying circuit 161 and the reference voltage Vcm provided by the reference signal generating circuit 183.

The level-shift circuit 182 is used for receiving the output signal Vamp of the amplifying circuit 161 and generating a level-shift signal Vsft=Vamp+Vr. The signal difference Vr may be one or more predetermined reference voltage values so that the level-shift circuit 182 may generate multiple level-shift signals according to different Vr. Moreover, the reference signal generating circuit 183 may generate one or more reference voltages Vcm for adjusting the voltage level of the output signal Vamp of the amplifying circuit 161. In this embodiment, Vr is configured to be 0, Vcm is configured to be Vdd/2, and V3 is configured to be the voltage level of the ground.

When the control signal clk_a is active, the switch 184 is conducted. When the control signal clk_a is inactive, the switch 184 is not conducted. When the control signal clk_b is active, the switch 185 is conducted. When the control signal clk_b is inactive, the switch 185 is not conducted.

The difference signal generating circuit 191 may be realized with amplifiers or other suitable signal processing circuits for generating a difference signal of the signal at the non-inverted input end and the signal at the inverted input end, a multiple of the difference signal, and/or a part of the difference signal.

In the period of time T1 in FIG. 2, the control signal clk_a is active and the control signal clk_b is inactive, the end A of the Hall Plate 121 is coupled with the voltage level V1, the end C of the Hall Plate 121 is coupled with the voltage level V2, the end B of the Hall Plate 121 is coupled with the output end 141, and the end D of the Hall Plate 121 is coupled with the output end 142. Therefore, the detected signal at the out-put ends 141 and 142 of the Hall effect sensor 110 is Vi(T1)=Vh+Voh.

The detected signal Vi(T1) generated by the Hall effect sensor 110 is transmitted to the amplifying circuit 161, and the output signal at the output end 167 of the amplifying circuit 161 is Vamp(T1)=Vcm+G×(Vh+Voh+Voa). Because the control signal clk_a is active and the control signal clk_b is inactive, the switch 184 is conducted and the switch 185 is not conducted. The voltage of the capacitor 181 is charged or discharged (depending on the previous status of the capacitor) to the voltage value Vhold=Vamp(T1).

In the period of time T2 in FIG. 2, the control signal clk_a is inactive and the control signal clk_b is active, the end B of the Hall Plate 121 is coupled with the voltage level V1, the end D of the Hall Plate 121 is coupled with the voltage level V2, the end A of the Hall Plate 121 is coupled with the output end 141, and the end C of the Hall Plate 121 is coupled with the output end 142. Therefore, the detected signal between the output ends 141 and 142 of the Hall effect sensor 110 is Vi(T2)=−Vh+Voh.

The detected signal Vi(T2) generated by the Hall effect sensor 110 is transmitted to the amplifying circuit 161, and the output signal at the output end 167 of the amplifying circuit 161 is Vamp(T2)=Vcm+G×(−Vh+Voh+Voa). Moreover, in this embodiment, the signal difference Vr of the level-shift circuit 182 is configured to be 0. Therefore, after the level-shift circuit 182 receives the signal Vamp(T2), the level-shift signal Vsft=Vamp(T2) is generated.

In the period of time T2, because the control signal clk_a is inactive and the control signal clk_b is active, the switch 184 is not conducted and the switch 185 is conducted. The difference signal generating circuit 191 receives the voltage Vhold provided by the capacitor 181 and the voltage Vsft provided by the level-shift circuit 182, and generates the output signal Vout=Vhold−Vsft=Vamp(T1)−Vamp(T2)=2×G×Vh at the output end. Therefore, in the ideal condition, the output signal Vout of the sensor module 100 is not affected by the offset voltage Voh of the Hall plate 121 and the offset voltage Voa of the auto-zero amplifier 150, and the amplified detected signal generated by the sensor module 100 may be more accurate.

The sensor module 100 may generate the amplified detected signal, and may also generate the other type output signals with the suitable configurations. For example, in other embodiments, the signal difference Vr of the level-shift circuit 182 may be configured to be one or more predetermined values, and the direction and the magnitude of the detected magnetic field may be determined according to the output voltage Vout of the sensor module 100.

For example, in one embodiment, a predetermined value Vr11 is configured to be twice of the output voltage at the output voltage end 167 of the amplifying circuit 161 when the magnitude of the magnetic field detected by the Hall effect sensor 110 equals to 1 Gauss and the direction of the magnetic field extrudes the plane of Hall plate 121 in FIG. 1. Another predetermined value Vr12 is configured to be twice of the output voltage at the output voltage end 167 of the amplifying circuit 161 when the magnitude of the magnetic field detected by the Hall effect sensor 110 equals to 1 Gauss and the direction of the magnetic field intrudes the plane of Hall plate 121 in FIG. 1. Moreover, the reference signal generating circuit 183 generates the reference voltage Vcm=Vdd/2.

In the period of time T1 in FIG. 2, the capacitor 181 of the auto-zero amplifier 150 is charged or discharged to the voltage value Vhold=Vamp(T1), i.e., Vhold=Vamp(T1)=Vcm+G×(Vh+Voh+Voa). In the period of time T3 of the period of time T2, the signal difference Vr of the level-shift circuit 182 is configured to be the predetermined value Vr11. The level-shift circuit 182 receives Vamp(T3) and accordingly generates the level-shift signal Vsft=Vr11+Vamp(T3), i.e., Vsft=Vr11+Vcm+G×(−Vh+Voh+Voa). Therefore, the difference signal generating circuit 191 generates the output voltage Vout(T3)=Vhold−Vsft=2×G×Vh−Vr11 in the period of time T3. Therefore, according to the output voltage Vout(T3) of the difference signal generating circuit 191, one may determine whether the direction of the magnetic field detected by the Hall effect sensor 110 extrudes the plane of the Hall plate 121 and the magnitude of the magnetic field is greater than 1 Gauss.

In the period of time T4 of the period of time T2, the signal difference Vr of the level-shift circuit 182 is configured to be the predetermined value Vr12. The level-shift circuit 182 receives Vamp(T4) and generates the level-shift signal Vsft=Vr12+Vamp(T4), i.e., Vsft=Vr12+Vcm+G×(−V+Voh+Voa). Therefore, the difference signal generating circuit 191 generates the output voltage Vout(T4)=Vhold−Vsft=2×G×Vh−Vr12 in the period T4. Therefore, according to the output voltage Vout(T4) of the difference signal generating circuit 191, one may determine whether the direction of the magnetic field detected by the Hall effect sensor 110 intrudes the plane of the Hall plate 121 and the magnitude of the magnetic field is greater than 1 Gauss.

In other embodiments, the reference voltage Vcm of the reference signal generating circuit 183 may be configured to be one or more predetermined values so that the direction and the magnitude of the detected magnetic field may be determined according to the output voltage Vout of the sensor module 100.

For example, in another embodiment, a predetermined value Vr21 is configured to be twice of the output voltage at the output voltage end 167 of the amplifying circuit 161 when the magnitude of the magnetic field detected by the Hall effect sensor 110 equals to 1 Gauss and the direction of the magnetic field extrudes the plane of Hall plate 121 in FIG. 1. Another predetermined value Vr22 is configured to be twice of the output voltage at the output voltage end 167 of the amplifying circuit 161 when the magnitude of the magnetic field detected by the Hall effect sensor 110 equals to 1 Gauss and the direction of the magnetic field intrudes the plane of Hall plate 121 in FIG. 1. Moreover, the signal difference Vr generated by the level-shift generating circuit 182 is configured to be 0.

In the period of time T1 in FIG. 2, the reference voltage Vcm of the reference signal generating circuit 183 is configured to be Vdd/2. In the period of time T3 of the period of time T2, the reference voltage Vcm of the reference signal generating circuit 183 is configured to be Vdd/2+Vr21 and the difference signal generating circuit 191 generates the output voltage Vout(T3)=Vamp(T1)−Vr21−Vamp(T3)=2×G×Vh−Vr21. Therefore, according to the output voltage Vout(T3) of the difference signal generating circuit 191, one may determine whether the direction of the magnetic field detected by the Hall effect sensor 110 extrudes the plane of the Hall plate 121 and the magnitude of the magnetic field is greater than 1 Gauss.

In the period of time T4 of the period of time T2, the reference voltage Vcm of the reference signal generating circuit 183 is configured to be Vdd/2+Vr22 in the period T4 of the period T2, and the difference signal generating circuit 191 generates the output voltage Vout(T4)=Vamp(T1)−Vr22−Vamp(T4)=2×G×Vh−Vr22. Therefore, according to the output voltage Vout(T4) of the difference signal generating circuit 191, one may determine whether the direction of the magnetic field detected by the Hall effect sensor 110 intrudes the plane of the Hall plate 121 and the magnitude of the magnetic field is greater than 1 Gauss.

The level-shift generating circuit 182 and the reference signal generating circuit 183 may be respectively or collectively realized with voltage divider circuits cooperated with switches and suitable control signals, or realized with other signal processing circuits for providing the required reference voltage signals. Furthermore, the level-shift generating circuit 182 and the reference signal generating circuit 183 may be realized with suitable signal processing circuit for providing the reference current signals and cooperating with the amplifying circuit 161.

In other embodiments, the level-shift circuit 182 may adopt one or more signals difference values, and the reference signal generating circuit 183 may also adopt one or more reference voltages correspondingly. The level-shift circuit 182 and the reference signal generating circuit 183 may be suitably configured to perform more diversified detection functions. Moreover, when the level-shift signal is not needed, transmission lines or other type of conductors may be used to replace the level-shift circuit 182 for coupling between the amplifying circuit 161 and the difference signal generating circuit 191.

In other embodiments, the Hall effect sensor 110 may also be realized with the Hall plate with more than four ends, Hall effect sensors in other shapes, and/or a plurality of Hall effect sensors. Besides, the Hall effect sensors may cooperate with any suitable type of noise or offset voltage reduction techniques.

In the foregoing embodiments, the Hall effect sensor 110 and the auto-zero amplifier 150 may be integrated to a single integrated circuits and/or a single package. The Hall effect sensor 110 and the auto-zero amplifier 150 may also be realized with one or more integrated circuit devices and/or discrete circuit devices.

In the foregoing embodiments, the difference signal generating circuit 191 may be configured to provide analog current output, analog voltage output, and/or other type of analog/digital output(s).

In the foregoing embodiments, the active durations of the control signals clk_a and clk_b are not necessary to be the same. For example, in the period of time T1 in FIG. 2, the capacitor 181 needs to be charged or discharged. While in the period of time T2, the capacitor 181 does not need to be charged or discharged. Therefore, the period of time T2 may be configured to be shorter than the period of time T1. Moreover, the periods of time T3 and T4 are not necessary to be the same.

In other embodiments, the switches 131-138 and the control signals clk_a and clk_b may be suitably integrated. For example, the switch 131 may be integrated with the switch 137 so that the end A of the Hall plate 121 is coupled with the voltage level V1 when the control signal clk_a is active and coupled with the output end 141 when the control signal clk_a is inactive.

In other embodiments, the voltage levels V1, V2, and V3 may be configured to be suitable voltage values, respectively. The amplifying circuit 161 may be realized with any suitable amplifier architecture for providing necessary gain for the auto-zero amplifier 150.

In other embodiments, the impedance of the difference signal generating circuit 191 is very high. In this situation, the amplifying circuit 161 mainly charges or discharges the capacitor 181 even if the switches 184 and 185 are both conducted. Therefore, the switch 185 may be omitted or keep conducted.

In other embodiments, the auto-zero amplifier 150 may be combined with other circuits for reducing the offset voltages and the noises and amplifying the signals. Therefore, the auto-zero amplifier 150 is not limited to be combined with the above sensors, and not limited to amplify small signals.

One of the advantages in the foregoing embodiment is that the offset voltage of the Hall effect sensor 110, the offset voltage of the auto-zero amplifier 150, and the voltage difference due to the mismatch of capacitors may be eliminated or reduced significantly.

Another advantage of the foregoing embodiments is that the capacitor 181 needs to be charged or discharged only in certain period of time. Therefore, the time for charging or discharging capacitors may be reduced, and the response time of the auto-zero amplifier 150 is reduced.

Certain terms are used throughout the description and following claims to refer to particular components. As one skilled in the art will appreciate, vendors may refer to a component by different names. This document does not intend to distinguish between components that differ in name but not in function. In the following description and in the claims, the terms "comprise" are used in an open-ended fashion, and thus should be interpreted to mean "include, but not limited to . . . . " The phrase "coupled with" is intended to compass any indirect or direct connection. Accordingly, if this document mentioned that a first device is coupled with a second device, it means that the first device may be directly or indirectly connected to the second device through an electrical connection, wireless communications, optical communications, or other signal connections with/without other intermediate devices or connection means.

In this disclosure and drawings, the signals are expressed as active high signals for the purpose of easier explanation. That is, the signal is considered to be active when the voltage level of the signal is higher than a predetermined value, and considered to be inactive when the voltage level of the signal is lower than the predetermined value. In other embodiments, the signals may be respectively realized with active high signals or active low signals. Moreover, people of ordinary skill in the art may appreciate that signals, devices, circuits, or operations in the description or drawings may be described in the form of voltage and/or current without departing from the spirit of the invention.

In the disclosure and drawings, the numbers, the positions, and the connections of the components are illustrative only. Other circuits, components, and connections may be omitted in the description and drawings for conciseness. People of ordinary skill in the art may appreciate that each component may be realized with one or more components and the function of the multiple components may be realized by a single component.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. An auto-zero amplifier, comprising:
   an amplifying circuit, comprising a first input end and a second input end, for receiving a first input signal in a first period and receiving a second input signal in a second period, respectively; and comprising a first output end, for generating a first output signal according to the first input signal in the first period and for generating a second output signal according to the second input signal in the second period;
   a first switch, coupled between the first output end and a capacitor, for charging or discharging the capacitor to a voltage with the first output signal when the first switch is conducted, and for keeping the capacitor at the voltage when the first switch is not conducted; and
   a difference signal generating circuit, comprising a third input end coupled with the first output end of the amplifying circuit and a fourth input end coupled with the capacitor, for generating a first difference signal of the first output signal and the second output signal, a multiple of the first difference signal, a part of the first difference signal, and/or a digital value of the first difference signal at a second output end according to the second output signal and the voltage of the capacitor in the second period.

2. The auto-zero amplifier of claim 1, further comprising:
   a level-shift circuit, coupled with the first output end of the amplifying circuit and the third input end of the difference signal generating circuit, for providing a first level-shift signal to the third input end of the difference signal generating circuit according to the second output signal in the second period;
   wherein there is a first signal difference existed between the first level-shift signal and the second output signal; and the difference signal generating circuit generates a second difference signal of the first output signal and the first level-shift signal, a multiple of the second difference signal, a part of the second difference signal, and/or a digital value of the second difference signal at the second output end according to the first level-shift signal and the voltage of the capacitor.

3. The auto-zero amplifier of claim 2, wherein the level-shift circuit further provides a second level-shift signal to the third input end of the difference signal generating circuit according to the second output signal in the second period; there is a second signal difference existed between the second level-shift signal and the second output signal; and the difference signal generating circuit generates a fourth difference signal of the first output signal and the second level-shift signal, a multiple of the fourth difference signal, a part of the fourth difference signal, and/or a digital value of the fourth difference signal at the second output end according to the second level-shift signal and the voltage of the capacitor.

4. The auto-zero amplifier of claim 2, further comprising:
   a second switch, coupled between the capacitor and the difference signal generating circuit, for transmitting the voltage of the capacitor to the fourth input end of the difference signal generating circuit when the second switch is conducted.

5. The auto-zero amplifier of claim 3, further comprising:
a reference signal generating circuit, for generating a first reference signal to the amplifying circuit;
wherein the amplifying circuit generates the first output signal according to the first input signal and the first reference signal in the first period, and generates the second output signal according to the second input signal and the first reference signal in the second period.

6. The auto-zero amplifier of claim 4, further comprising:
a reference signal generating circuit, for generating a first reference signal to the amplifying circuit;
wherein the amplifying circuit generates the first output signal according to the first input signal and the first reference signal in the first period, and generates the second output signal according to the second input signal and the first reference signal in the second period.

7. The auto-zero amplifier of claim 3, further comprising:
a reference signal generating circuit, for generating a first reference signal and a second reference signal to the amplifying circuit;
wherein the amplifying circuit generates the first output signal according to the first input signal and the first reference signal in the first period, and generates the second output signal according to the second input signal and the second reference signal in the second period.

8. The auto-zero amplifier of claim 4, further comprising:
a reference signal generating circuit, for generating a first reference signal and a second reference signal to the amplifying circuit;
wherein the amplifying circuit generates the first output signal according to the first input signal and the first reference signal in the first period, and generates the second output signal according to the second input signal and the second reference signal in the second period.

9. A sensor module, comprising:
a Hall effect sensor, comprising a first end, a second end, a third end, and a fourth end, for providing a first detected signal at the first end and the second end in a first period and for providing a second detected signal at the third end and the fourth end in a second period;
an amplifying circuit, coupled with the Hall effect sensor, comprising a first input end and a second input end, for receiving the first detected signal in the first period and receiving the second detected signal in the second period, respectively; and comprising a first output end, for providing a first output signal according to the first detected signal in the first period and for providing a second output signal according to the second detected signal in the second period;
a switch, coupled between the first output end and a capacitor, for charging or discharging the capacitor to a voltage with the first output signal when the switch is conducted, and for keeping the capacitor at the voltage when the switch is not conducted; and
a difference signal generating circuit, comprising a third input end coupled with the first output end of the amplifying circuit and a fourth input end coupled with the capacitor, for generating a first difference signal between the first output signal and the second output signal, a multiple of the first difference signal, a part of the first difference signal, and/or a digital value of the first difference signal at a second output end according to the second output signal and the voltage of the capacitor in the second period.

10. The sensor module of claim 9, further comprising:
a level-shift circuit, coupled between the first output end of the amplifying circuit and the third input end of the difference signal generating circuit, for providing a first level-shift signal to the third input end of the difference signal generating circuit according to the second output signal in the second period;
wherein there is a first signal difference signal existed between the first level-shift signal and the second output signal; and the difference signal generating circuit generates a second difference signal of the first output signal and the first level-shift signal, a multiple of the second difference signal, a part of the second difference signal, and/or a digital value of the second difference signal at the second output end according to the first level-shift signal and the voltage of the capacitor.

11. The sensor module of claim 10, wherein the level-shift circuit further provides a second level-shift signal to the third input end of the difference signal generating circuit according to the second output signal in the second period; there is a second signal difference existed between the second level-shift signal and the second output signal; and the difference signal generating circuit generates a third difference signal of the first output signal and the second level-shift signal, a multiple of the third difference signal, a part of the third difference signal, and/or a digital value of the third difference signal at the second output end according to the second level-shift signal and the voltage of the capacitor.

12. The sensor module of claims 11, further comprising:
a reference signal generating circuit, for generating a first reference signal to the amplifying circuit;
wherein the amplifying circuit generates the first output signal according to the first input signal and the first reference signal in the first period, and generates the second output signal according to the second input signal and the first reference signal in the second period.

13. The sensor module of claims 11, further comprising:
a reference signal generating circuit, for generating a first reference signal and a second reference signal to the amplifying circuit;
wherein the amplifying circuit generates the first output signal according to the first input signal and the first reference signal in the first period, and generates the second output signal according to the second input signal and the second reference signal in the second period.

14. An auto-zero amplifier, comprising:
an amplifying circuit, for generating a first output signal according to a first input signal, and generating a second output signal according to a second input signal;
a switch, coupled between the amplifying circuit and a capacitor, for charging or discharging the capacitor to a voltage with the first output signal when the switch is conducted, and for keeping the capacitor keeping the voltage when the switch is not conducted; and
a difference signal generating circuit, coupled with the amplifying circuit and the capacitor, for generating a first difference signal of the first output signal and the second output signal, a multiple of the first difference signal, a part of the first difference signal, and/or a digital output value for the first difference signal according to the second output signal and the voltage of the capacitor.

15. The auto-zero amplifier of claim 14, further comprising:
a level-shift circuit, coupled between the amplifying circuit and the difference signal generating circuit, for providing a first level-shift signal to the difference signal generating circuit according to the second output signal, wherein there is a first signal difference existed between the first level-shift signal and the second output signal;

wherein the difference signal generating circuit generates a second difference signal of the first output signal and the first level-shift signal, a multiple of the second difference signal, a part of the second difference signal, and/or a digital value for the second difference signal according to the first level-shift signal and the voltage of the capacitor.

16. The auto-zero amplifier of claim 15, wherein the level-shift circuit further provides a second level-shift signal to the difference signal generating circuit according to the second output signal; there is a second signal difference existed between the second level-shift signal and the second output signal; and the difference signal generating circuit generates a third difference signal of the first output signal and the second level-shift signal, a multiple of the third difference signal, a part of the third difference signal, and/or a digital value for the third difference signal according to the second level-shift signal and the voltage of the capacitor.

17. The auto-zero amplifier of claim 15, further comprising:
a reference signal generating circuit, for generating a first reference signal to the amplifying circuit;
wherein the amplifying circuit generates the first output signal according to the first input signal and the first reference signal, and generates the second output signal according to the second input signal and the first reference signal.

18. The auto-zero amplifier of claim 16, further comprising:
a reference signal generating circuit, for generating a first reference signal to the amplifying circuit;
wherein the amplifying circuit generates the first output signal according to the first input signal and the first reference signal, and generates the second output signal according to the second input signal and the first reference signal.

19. The auto-zero amplifier of claim 15, further comprising:
a reference signal generating circuit, for generating a first reference signal and a second reference signal to the amplifying circuit;
wherein the amplifying circuit generates the first output signal according to the first input signal and the first reference signal, and generates the second output signal according to the second input signal and the second reference signal.

20. The auto-zero amplifier of claim 16, further comprising:
a reference signal generating circuit, for generating a first reference signal and a second reference signal to the amplifying circuit;
wherein the amplifying circuit generates the first output signal according to the first input signal and the first reference signal, and generates the second output signal according to the second input signal and the second reference signal.

* * * * *